(12) United States Patent
Li

(10) Patent No.: US 12,204,837 B2
(45) Date of Patent: Jan. 21, 2025

(54) TAG COORDINATE DETERMINATION METHOD AND APPARATUS, COMPUTER-READABLE MEDIUM AND ELECTRONIC DEVICE

(71) Applicant: CHANGXIN MEMORY TECHNOLOGIES, INC., Hefei (CN)

(72) Inventor: Jing Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 544 days.

(21) Appl. No.: 17/648,676

(22) Filed: Jan. 23, 2022

(65) Prior Publication Data

US 2022/0146927 A1     May 12, 2022

Related U.S. Application Data

(63) Continuation of application No. PCT/CN2021/104350, filed on Jul. 2, 2021.

(30) Foreign Application Priority Data

Aug. 26, 2020 (CN) .......................... 202010872112.1

(51) Int. Cl.
    *G06F 30/392*      (2020.01)
    *G03F 7/00*      (2006.01)

(52) U.S. Cl.
    CPC ........ *G06F 30/392* (2020.01); *G03F 7/70541* (2013.01)

(58) Field of Classification Search
USPC ........................... 716/50, 51, 52, 53, 54, 55
See application file for complete search history.

(56) References Cited

U.S. PATENT DOCUMENTS

| | | | |
|---|---|---|---|
| 6,538,740 B1 * | 3/2003 | Shiraishi | |
| 6,949,755 B2 | 9/2005 | Tanaka | |
| 7,011,912 B2 | 3/2006 | Choi | |
| 7,355,187 B2 | 4/2008 | Tanaka | |
| 9,638,739 B2 | 5/2017 | Kusunose et al. | |
| 11,003,707 B2 * | 5/2021 | Joshi | |
| 2003/0235330 A1 | 12/2003 | Tanaka | |
| 2004/0091795 A1 | 5/2004 | Choi | |
| 2005/0242285 A1 | 11/2005 | Tanaka | |
| 2010/0086236 A1 * | 4/2010 | Lapstun | |
| 2013/0245971 A1 | 9/2013 | Kusunose et al. | |

(Continued)

FOREIGN PATENT DOCUMENTS

| CN | 102109771 A | 6/2011 |
|---|---|---|
| CN | 102566311 A | 7/2012 |

(Continued)

*Primary Examiner* — Brian Ngo
(74) *Attorney, Agent, or Firm* — Syncoda LLC; Feng Ma

(57) ABSTRACT

A tag coordinate determination method includes: generating a tag unit for placing a detection tag; setting the detection tag and the tag unit in an image of a photomask, and obtaining a tag position file of the image, the tag position file including position coordinates of the tag unit in the image; and acquiring position coordinates of a tag to be processed in the image according to the tag position file. The tag coordinate determination method can overcome to a certain extent the problem of manually capturing the coordinates being prone to errors, thereby improving accuracy of coordinate determination.

20 Claims, 8 Drawing Sheets

(56) References Cited

U.S. PATENT DOCUMENTS

2017/0351173 A1* 12/2017 Funabashi
2019/0265595 A1* 8/2019 Funabashi

FOREIGN PATENT DOCUMENTS

| CN | 102866604 A | 1/2013 |
| CN | 108090453 A | 5/2018 |
| CN | 108709500 A | 10/2018 |
| CN | 111078775 A | 4/2020 |
| CN | 111142343 A | 5/2020 |

* cited by examiner

TAG COORDINATE DETERMINATION METHOD AND APPARATUS, COMPUTER-READABLE MEDIUM AND ELECTRONIC DEVICE

CROSS-REFERENCE TO RELATED APPLICATIONS

This is a continuation of International Patent Application No. PCT/CN2021/104350 filed on Jul. 2, 2021, which claims priority to Chinese Patent Application No. 202010872112.1 filed on Aug. 26, 2020. The disclosures of the above-referenced applications are hereby incorporated by reference in their entirety.

BACKGROUND

In manufacturing and production of an integrated circuit, it may be needed to use patterns on a wafer dicing lane for exposure alignment and measurement in a manufacturing process. In order to quickly find out positions of these patterns on the wafer dicing lane and set a program during measurement, coordinates of these patterns in the frame layout must be given first.

SUMMARY

Embodiments of the present disclosure relate to the technical field of semiconductor manufacturing, and in particular to a tag coordinate determination method, a tag coordinate determination apparatus, a computer-readable medium and an electronic device.

The present disclosure provides a tag coordinate determination method, a tag coordinate determination apparatus, a computer-readable medium and an electronic device, which can overcome to a certain extent the problem of manually capturing the coordinates being prone to errors, thereby improving accuracy of coordinates of the tag.

According to one aspect of the embodiments of the present disclosure, a tag coordinate determination method is provided, including: generating a tag unit for placing a detection tag; setting the detection tag and the tag unit in an image of a photomask, and obtaining a tag position file of the image, the tag position file including position coordinates of the tag unit in the image; and acquiring position coordinates of a tag to be processed in the image according to the tag position file.

According to another aspect of the embodiments of the present disclosure, a tag coordinate determination apparatus is provided, including a tag generation module, a tag position determination module and a tag coordinate acquisition module. The tag generation module is configured to generate a tag unit for placing a detection tag. The tag position determination module is configured to set the detection tag and the tag unit in an image of a photomask and obtain a tag position file of the image, the tag position file including position coordinates of the tag unit in the image. The tag coordinate acquisition module is configured to acquire position coordinates of a tag to be processed in the image according to the tag position file.

According to yet another aspect of the embodiments of the present disclosure further disclose a non-transitory computer-readable medium having stored therein instructions that, when executed by a processor, causes the processor to perform a tag coordinate determination method, the method comprising: generating a tag unit for placing a detection tag; setting the detection tag and the tag unit in an image of a photomask, and obtaining a tag position file of the image, the tag position file comprising position coordinates of the tag unit in the image; and acquiring position coordinates of a tag to be processed in the image according to the tag position file.

The embodiments of the present disclosure further disclose an electronic device, including: a processor; and a memory for storing instructions executable by the processor; wherein the processor is configured to: generating a tag unit for placing a detection tag; setting the detection tag and the tag unit in an image of a photomask, and obtaining a tag position file of the image, the tag position file comprising position coordinates of the tag unit in the image; and acquiring position coordinates of a tag to be processed in the image according to the tag position file.

BRIEF DESCRIPTION OF THE DRAWINGS

The accompanying drawings, which are incorporated herein and form a part of the specification, illustrate embodiments in accordance with the present disclosure, and together with the specification, serve to explain the principles of the embodiments of the present disclosure. Apparently, the accompanying drawings in the following descriptions are merely some embodiments of the present disclosure, and a person of ordinary skill in the art can also obtain other accompanying drawings according to these accompanying drawings without creative effort. In the drawings.

DETAILED DESCRIPTION

According to the design requirements of the patterns, the patterns are drawn in drawing software and then placed in the frame layout. The same product will be placed in more than one position. Different products have different frame layouts and different placement positions. Therefore, it may be needed to measure the patterns at different positions for many times with a drawing tool to determine the coordinates. Next, the coordinate book is filled in with the captured coordinates manually. Such operations are time consuming, and are prone to errors.

Figure 1:
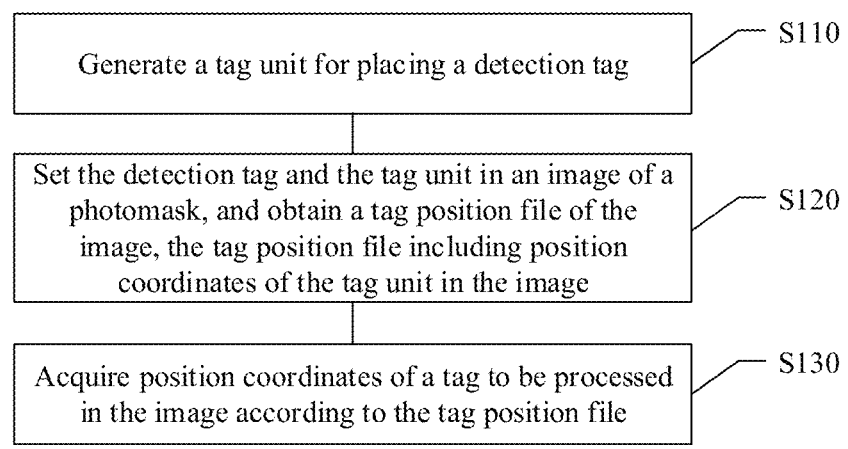
FIG. 1 schematically shows a flowchart of a tag coordinate determination method according to one embodiment of the present disclosure.

An exemplary implementation provides a tag coordinate determination method. With reference to FIG. 1, the tag coordinate determination method can include the steps as follows.

In step S110, a tag unit for placing a detection tag is generated.

In step S120, the detection tag and the tag unit are set into an image of a photomask, and a tag position file of the image is obtained. The tag position file includes position coordinates of the tag unit in the image.

In step S130, position coordinates of a tag to be processed in the image are acquired according to the tag position file.

In the tag coordinate determination method provided by an exemplary implementation of the present disclosure, by setting the tag unit of the detection tag into the image of the photomask, the position coordinates of the tag unit in the image are obtained, thereby obtaining the coordinates of the tag to be processed by identifying the tag to be processed in the detection tag. On the one hand, there is no need to manually measure the coordinates of the tag, so that the problem of inaccurate measurement of the tag coordinate can be avoided, thereby improving the accuracy of the coordinates. On the other hand, the efficiency of determining the tag coordinate can be improved, and especially in a case where there are a large number of tags to be processed, there is no need to manually capture the coordinates one by one, thereby greatly reducing labor and time costs.

The above steps of this exemplary implementation will be described below in more detail.

In step S110, the tag unit for placing the detection tag is generated.

The detection tag refers to a pattern for detecting a process quality, for example, a lithography overlay tag, a critical dimension detection tag, a film thickness detection tag, etc. In general cases, there are a plurality of detection tags on a photomask. According to the types of the tags required by a product owner, each detection tag can be of a different pattern and of a different size, which is not particularly limited in this implementation. For example, a detection tag and a tag unit can be generated with a drawing tool, and the tag unit can be a pattern in a regular shape. First, the detection tag is drawn in the drawing tool. Next, the tag unit of the detection tag is drawn with the drawing tool. For example, the tag unit can be a tag frame for completely placing the detection tag. For each tag unit, a corresponding tag frame can be made. Exemplarily, each detection tag corresponds to one tag unit, and a minimum distance from a boundary of the tag unit to the detection tag is greater than 1.5 μm, for example, 2 μm, 2.5 μm, such that the detection tag will not be affected by the surrounding pattern thereof.

Figure 2:
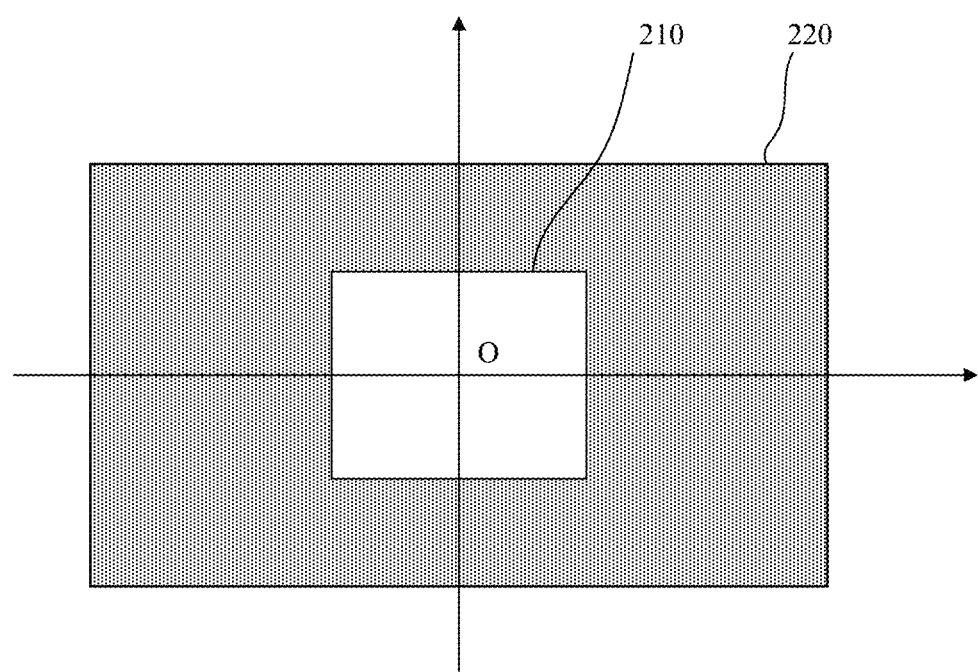
FIG. 2 schematically shows a schematic diagram of a detection tag and a tag unit according to one embodiment of the present disclosure.

In an exemplary implementation, a center position of the detection tag can be determined with the drawing tool. The tag unit of the detection tag is generated with the center position as an origin, such that the center position of the detection tag coincides with a center position of the tag unit, thereby determining the coordinates of the detection tag according to the coordinates of the tag unit. For example, as shown in FIG. 2, a center position of a detection tag 210, that is, Point O, can be determined with the drawing tool, and a tag unit 220 is established with this point as the origin of the coordinates. The tag unit 220 can be a circumscribed rectangle of the detection tag, and the center positions of the rectangle 220 and the detection tag 210 are both Point O.

In step S120, the detection tag and the tag unit are set into the image of the photomask, and the tag position file of the image is obtained. The tag position file includes the tag unit and the position coordinates of the tag unit in the image.

Figure 3:
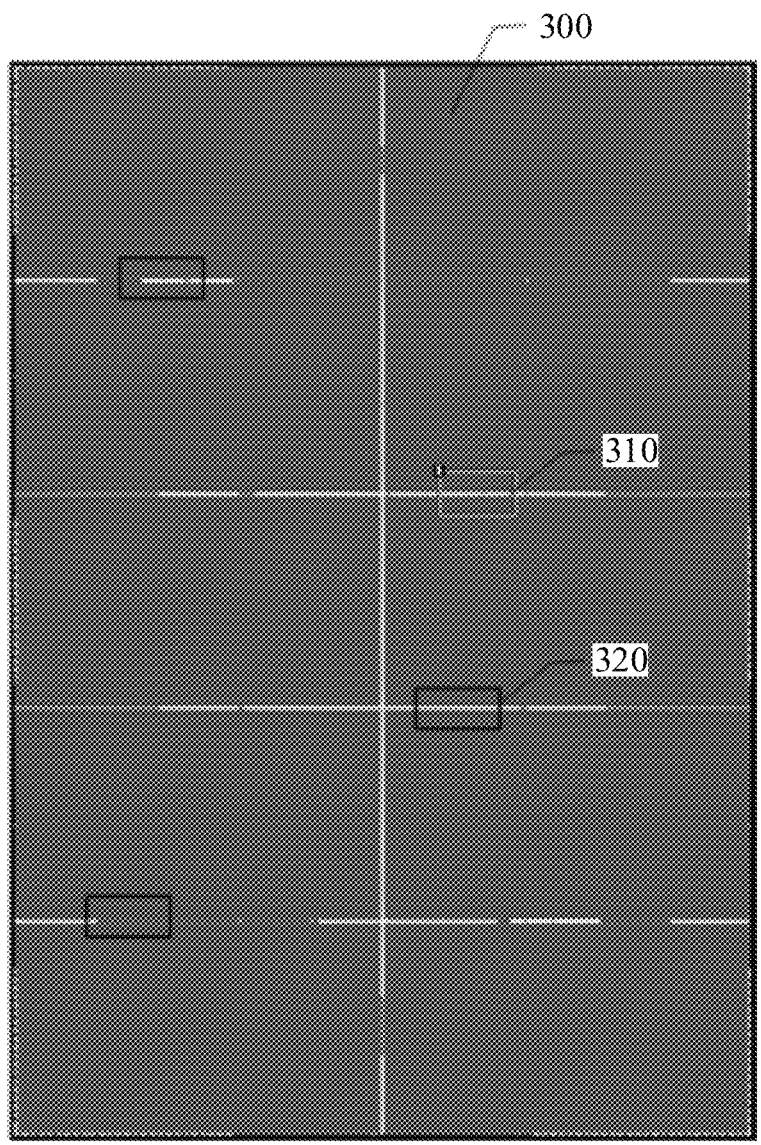
FIG. 3 schematically shows a schematic diagram of an image of a photomask according to one embodiment of the present disclosure.

The image may refer to a frame layout image of the photomask. Different products have different frame layouts, and each detection tag on the photomask needs to be set in the frame layout. In an exemplary implementation, the detection tag with the tag unit can be placed in a target area in the image of the photomask. For the image of the same photomask, a plurality of detection tags can be placed at different positions in the image. An engineer can select a placement position of each detection tag according to the type of the tag and a space of a dicing lane of the mask, such that situations of different areas on an exposure area of the entire lithography mask can be detected by each detection tag. Therefore, the target area in the image can include a plurality of positions, and the target area can be a dicing lane area in the image of the photomask. Exemplarily, positions of the plurality of detection tags and tag units are shown in FIG. 3. The image of the photomask is 300. One detection tag can be placed at position 310 in the image 300, and another detection tag can be placed at position 320.

After the detection tag is placed in the image of the photomask, the drawing tool can directly measure position coordinates of each tag unit, and output the position coordinates of each tag unit into one tag position file. As the center of the tag unit coincides with the center of the detection tag, the obtained position coordinates of the tag unit can be used as the position coordinates of the detection tag, and there is no need to manually and repeatedly measure the positions of the detection tag. This not only can save labor and time costs, but also avoid the problem of inaccurate measurement caused by manual measurements, thereby improving the accuracy of the tag coordinate.

The tag position file can record each tag unit and the position coordinates of the tag unit in the form of a list. In addition, the target area can include a plurality of areas in the image. As a result, the detection tag can be placed many times respectively at a plurality of different positions of the image of the photomask for measurements, to obtain a plurality of different position coordinates of each tag unit.

In the exemplary implementation, when generating the tag unit of the detection tag, a name can be determined for each tag unit. The name can be used to tag each tag unit. Also, the name can be a number, a text, a symbol, or a combination of number, text, symbol and other elements. When acquiring the tag position file of the image, the position coordinates corresponding to the tag unit can be recorded based on the name of the tag unit. Specifically, the position coordinates of each tag unit in the image can be measured according to the name of the tag unit, and the measured position coordinates can be mapped with the name of the tag unit. Each mapping relationship is saved as the tag position file. Exemplarily, a GDS file of a frame layout image can be output with Ebview drawing software. The GDS file includes the name of the tag unit and position coordinates of the tag unit. Afterwards, the GDS file can be converted into a CSV file through instructions or scripts. The CSV file can be identified by Excel, which is convenient for reading and identifying the coordinates of the tag unit.

In an exemplary implementation, the method further includes: checking whether the position coordinates of the tag unit are coordinates in a rectangular coordinate system with a bottom left corner of the image as an origin. Specifically, the bottom left corner of the image is a center point of a cross tag. When the position coordinates of the tag unit are coordinates in a rectangular coordinate system with the center point of the cross tag as the origin, the position coordinates of the tag unit obtained therewith can be directly used to set a measurement program, thereby reducing the workload. When the position coordinates of the tag unit are not the coordinates in the rectangular coordinate system with the bottom left corner of the image as the origin, the position coordinates of the tag unit need to be converted into the coordinates in the rectangular coordinate system with the bottom left corner of the image as the origin. For example, the position coordinates (x, y) of the tag unit are acquired in the rectangular coordinate system with the center of the image as the origin, the coordinates of the center of the image in the rectangular coordinate system with the bottom left corner of the image as the origin are (a, b), and then, the coordinates of the position coordinates of the tag unit in the rectangular coordinate system with the bottom left corner of the image as the origin are (x+a, y+b).

In step S130, the position coordinates of the tag to be processed in the image are acquired according to the tag position file.

Figure 4:
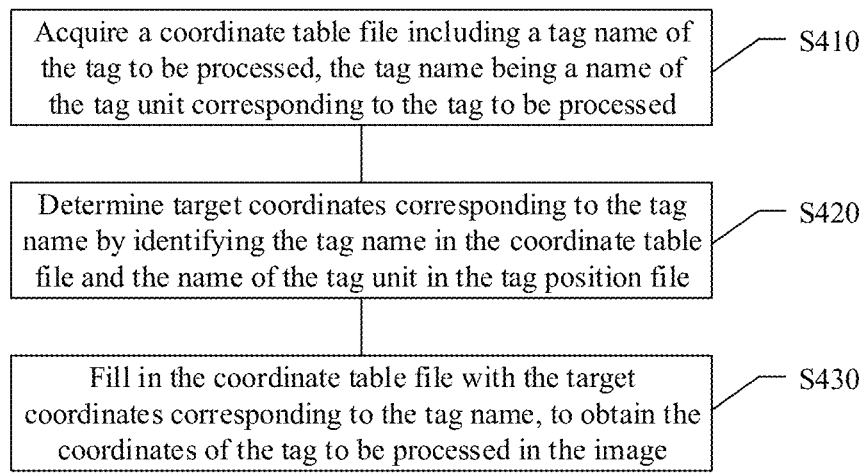
FIG. 4 schematically shows a flowchart of a tag coordinate determination method according to another embodiment of the present disclosure.

In an exemplary implementation, the tag to be processed can be one or more of the detection tags. The detection requirements are different in different processing flows. The tag to be processed in the detection tag can be manually determined according to the current detection requirement. Exemplarily, a coordinate table file can be filled in manually with the tag to be processed that needs to be processed currently. FIG. 4 schematically shows a flowchart of acquiring coordinates of a tag to be processed in an image. As shown in FIG. 4, the method can include step S410, step S420, and step S430.

Figure 5:
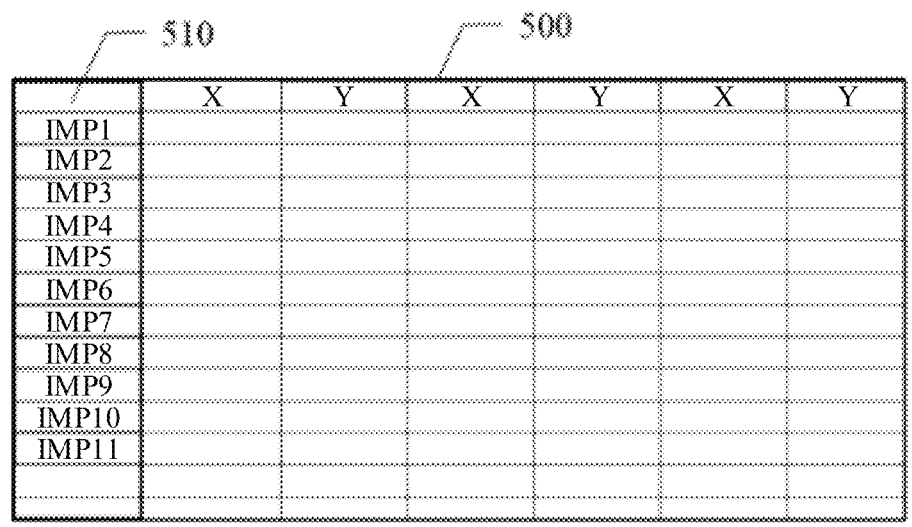
FIG. 5 schematically shows a schematic diagram of a coordinate table according to one embodiment of the present disclosure.

In step S410, a coordinate table file including a tag name of the tag to be processed is acquired. The tag name is the name of the tag unit corresponding to the tag to be processed. According to the name determined for each tag unit when establishing the tag unit of the detection tag, a tag unit that needs to be processed can be selected from each tag unit, the selected tag unit is used as the tag to be processed, and thereby, the name of the selected tag unit is used as the tag name of the tag to be processed. Exemplarily, the coordinate table can be as shown in FIG. 5. The coordinate table file 500 can include a plurality of column attributes. The first column attribute shown as 510 can be the tag name of the tag to be processed, and the coordinate table may further include coordinate attribute of the tag to be processed.

In step S420, a target position corresponding to the tag name is determined by identifying the tag name in the coordinate table file and the name of the tag unit in the tag position file. First, each row of data in the coordinate table file can be sequentially read to acquire the tag name in each row of data. Next, the tag unit matched with the tag name is determined by comparing the acquired tag name respectively with each name saved in the tag position file, thereby acquiring position coordinates of the tag unit. The position coordinates of the tag unit matched with the tag name are used as the target coordinates. For example, in FIG. 5, the tag name of the first row of data in the coordinate table is "IMP1". If the tag name "IMP1" can be matched in the tag position file, then position coordinates corresponding to "IMP1" in the tag position file can be used as the target coordinates.

In step S430, the coordinate table file is filled in with the target position corresponding to the tag name, to obtain the coordinates of the tag to be processed in the image. Specifically, after obtaining the target position corresponding to the tag name, a corresponding cell in the coordinate table can be filled in with the target position corresponding to the tag name, thereby obtaining a complete coordinate table. A measurement program "recipe" can be set based on the coordinates of the tag to be processed in the coordinate table so as to realize accurate measurement of the detection tag on the photomask, thereby quickly finding out a position of the detection tag on a wafer dicing lane to perform measurement.

In an exemplary implementation, the coordinates corresponding to the tag to be processed can be captured from the tag position file with a table processing tool. The table processing tool can compare the tables to determine a same tag in the two files, thereby outputting data with the same tag. For example, the coordinate table can be an Excel table, and the tag position file can be a CSV file. The tag name in the coordinate table file can be identified through an Excel VBA, and the Excel VBA can read the contents of the CSV file, capture the data of the same cell in the tag position file and convert the data into the coordinate table Excel table. In this implementation, there is no need to manually query the coordinates of each tag to be processed, and the coordinates of all the tags to be processed can be exported in batches from the tag position file. When there are a large number of tags to be processed, the efficiency can be greatly improved, and the coordinates of the tag in the image can be quickly obtained.

In the exemplary implementation, a tag coordinate determination apparatus is further provided, which is configured to execute the above tag coordinate determination method of the present disclosure. The apparatus can be applied to a server or a terminal device.

Figure 6:
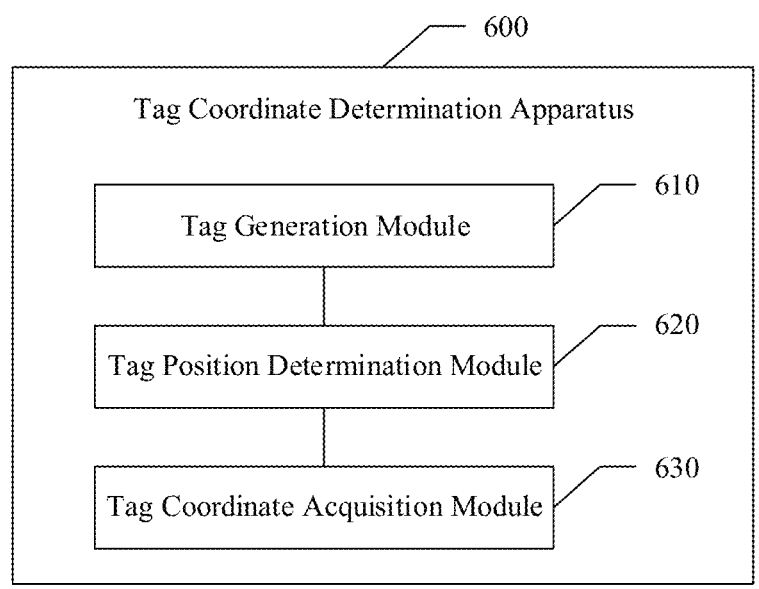
FIG. 6 schematically shows a block diagram of a tag coordinate determination apparatus according to one embodiment of the present disclosure.

With reference to FIG. 6, the tag coordinate determination apparatus 600 can include: a tag generation module 610, a tag position determination module 620, and a tag coordinate acquisition module 630.

The tag generation module 610 is configured to generate a tag unit for placing a detection tag.

The tag position determination module 620 is configured to set the detection tag and the tag unit in an image of a photomask and obtain a tag position file of the image. The tag position file includes position coordinates of the tag unit in the image.

The tag coordinate acquisition module 630 is configured to acquire coordinates of a tag to be processed in the image according to the tag position file.

In an exemplary embodiment of the present disclosure, the tag generation module 610 can be specifically configured to: generate the tag unit based on a center position of the detection tag, such that a center position of the tag unit coincides with the center position of the detection tag.

In an exemplary embodiment of the present disclosure, the apparatus 600 can further include a name determination module, configured to determine a name of each of the tag units so as to generate the tag position file based on the name of the tag unit.

In an exemplary embodiment of the present disclosure, the tag position determination module 620 can include a position output unit and a position mapping unit.

The position output unit is configured to output the position coordinates of the tag unit in the image of the photomask with a drawing tool.

The position mapping unit is configured to construct a mapping relationship between the tag unit and the position coordinates based on the name of the tag unit, to generate the tag position file.

In an exemplary embodiment of the present disclosure, the tag coordinate acquisition module 630 can include a coordinate table acquisition unit, a name identification unit and a coordinate filling unit.

The coordinate table acquisition unit is configured to acquire a coordinate table file including a tag name of the tag to be processed. The tag name is the name of the tag unit corresponding to the tag to be processed.

The name identification unit is configured to determine target coordinates corresponding to the tag name by identifying the tag name in the coordinate table file and the name of the tag unit in the tag position file.

The coordinate filling unit is configured to fill in the coordinate table file with the target coordinates corresponding to the tag name, to obtain the coordinates of the tag to be processed in the image.

In an exemplary embodiment of the present disclosure, the tag coordinate acquisition module 630 can be specifically configured to: capture coordinates corresponding to the tag to be processed from the tag position file with a table processing tool.

In an exemplary embodiment of the present disclosure, the tag position determination module 620 is configured to: set the detection tag and the tag unit in a target area in the image of the photomask. The target area at least includes a dicing lane area of the photomask.

In an exemplary embodiment of the present disclosure, the apparatus further includes a tag detection module, configured to: check whether the position coordinates of the tag unit are coordinates in a rectangular coordinate system with a bottom left corner of the image as an origin.

In an exemplary embodiment of the present disclosure, the tag detection module is further configured to: convert, if the position coordinates of the tag unit are not the coordinates in the rectangular coordinate system with the bottom left corner of the image as the origin, the position coordinates of the tag unit into the coordinates in the rectangular coordinate system with the bottom left corner of the image as the origin.

In the tag coordinate determination apparatus according to the exemplary embodiments of the present disclosure, each of the functional modules corresponds to the steps in the exemplary embodiment of the tag coordinate determination method above. Therefore, for details that are not disclosed in the embodiments of the apparatus of the present disclosure, reference can be made to the above embodiments of the tag coordinate determination method of the present disclosure.

Figure 7:
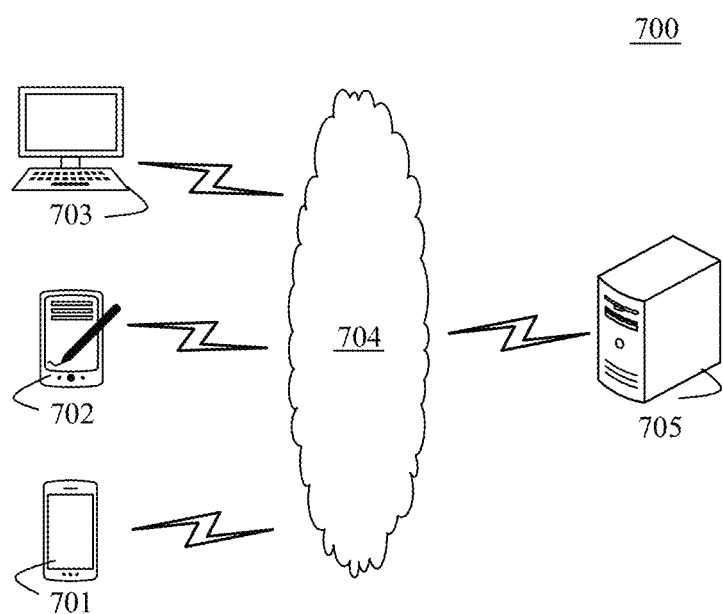
FIG. 7 schematically shows a system architecture diagram for realizing the tag coordinate determination method according to one embodiment of the present disclosure.

With reference to FIG. 7, FIG. 7 shows a schematic diagram of a system architecture of an exemplary application environment that can apply the tag coordinate determination method and the tag coordinate determination apparatus of the embodiments of the present disclosure.

As shown in FIG. 7, the system architecture 700 can include one or more of terminal devices 701, 702 and 703, a network 704 and a server 705. The network 704 is configured to provide a medium for communication links between the terminal devices 701, 702 and 703 and the server 705. The network 704 can include various connection types, for example, wired and wireless communication links or fiber-optic cables, etc.

The terminal devices 701, 702, and 703 can be various electronic devices with display screen, including but not limited to, desktop computer, portable computer, smart phone, tablet computer and the like. It should be understood that the number of the terminal devices, the networks, and the servers in FIG. 7 is merely illustrative. According to needs for implementations, there can be any number of terminal devices, networks and servers. For example, the server 705 can be a server cluster composed of a plurality of servers.

The tag coordinate determination method provided by the embodiments of the present disclosure is usually executed by the terminal devices 701, 702 and 703. Correspondingly, the tag coordinate determination apparatus can be disposed in the terminal devices 701, 702 and 703.

Figure 8:
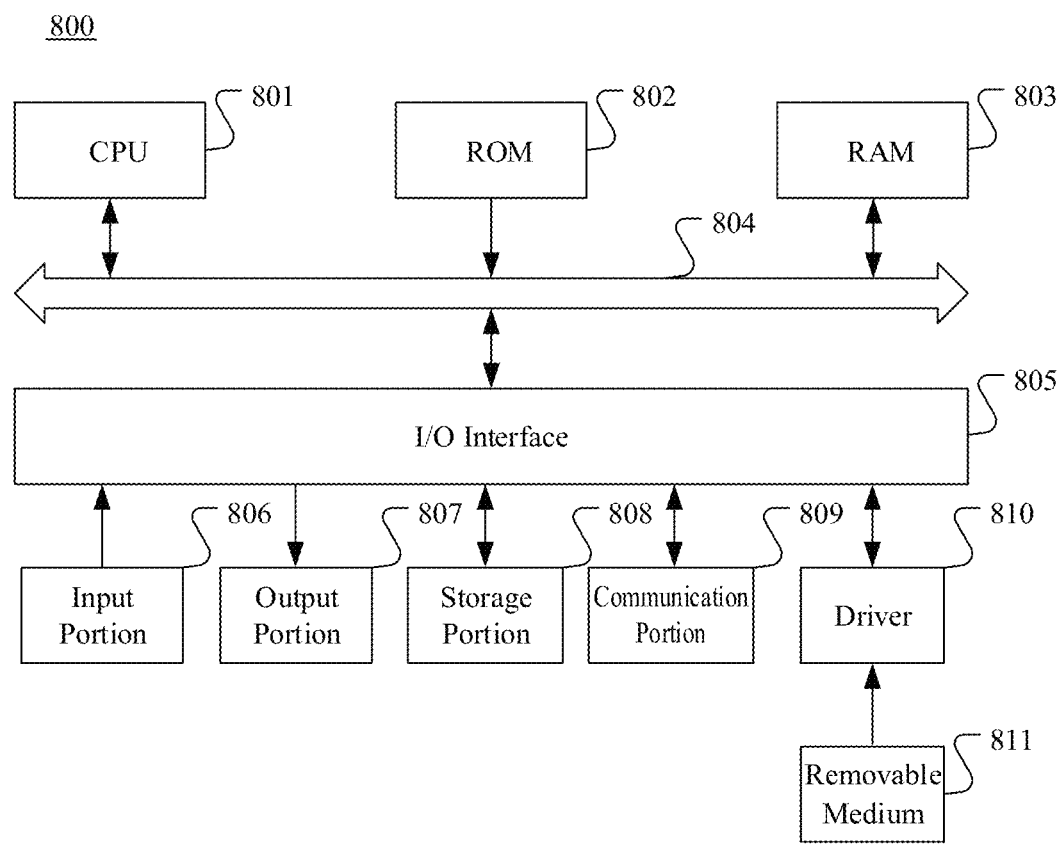
FIG. 8 shows a schematic structural diagram of a computer system suitable for realizing an electronic device according to an embodiment of the present disclosure.

FIG. 8 shows a schematic structural diagram of a computer system suitable for realizing an electronic device according to an embodiment of the present disclosure.

It should be noted that the computer system 800 of the electronic device shown in FIG. 8 is only an example, and should not bring any limitation to the functions and application scope of the embodiments of the present disclosure.

As shown in FIG. 8, the computer system 800 includes a Central Processing Unit (CPU) 801, which can execute various proper actions and processing according to a program stored in a Read Only Memory (ROM) 802 or a program loaded from a storage portion 808 into a Random-Access Storage (RAM) 803. Various programs and data required by system operations are also stored in the RAM 803. The CPU 801, the ROM 802 and the RAM 803 are connected to each other through a bus 804. An input/output (I/O) interface 805 is also connected to the bus 804.

The following components are connected to the I/O interface 805: an input portion 806, including a keyboard, a mouse and the like; an output portion 807, including such as a Cathode-Ray Tube (CRT), a Liquid Crystal Display (LCD), an organic light-emitting diode (OLED) display, a loudspeaker; a storage portion 808, including a hard disk and the like; and a communication portion 809, including a network interface card such as an LAN card, a modem. The communication portion 809 executes communication processing via a network such as the Internet. A driver 810 is also connected to the I/O interface 805 as needed. A removable medium 811, such as a magnetic disk, an optical disk, a magneto-optical disk, a semiconductor memory, is installed on the driver 810 as needed, such that the computer program read therefrom is installed into the storage portion 808 as needed.

According to the embodiments of the present disclosure, the process described below with reference to the flowchart can be realized as a computer software program. For example, an embodiment of the present disclosure includes a computer program product, including a computer program carried on a non-transitory computer-readable medium. The computer program includes program codes for executing the method shown in the flowchart. In such embodiment, the computer program can be downloaded and installed from the network through the communication portion 809, and/or installed from the removable medium 811. When the computer program is executed by the Central Processing Unit (CPU) 801, various functions defined in the method and apparatus of the present disclosure are executed.

It should be noted that the non-transitory computer-readable medium shown in the embodiment of the present disclosure can be a computer-readable signal medium or a computer-readable storage medium or any combination of the two above. The computer-readable storage medium can be, for example, but not limited to, an electrical, magnetic, optical, electromagnetic, infrared, or semiconductor system, apparatus or device, or any combinations thereof. More specific examples of the computer-readable storage medium may include, but not limited to: an electrical connection with one or more wires, a portable computer magnetic disk, a hard disk, a Random-Access Memory (RAM), a Read Only Memory (ROM), an Erasable Programmable Read Only Memory (EPROM or flash memory), an optical fiber, a portable Compact Disk Read Only Memory (CD-ROM), an optical storage device, a magnetic storage device, or any suitable combination of the above. In the embodiment of the present disclosure, the computer-readable storage medium can be any tangible medium including or storing a program, which can be used by or in combination with an instruction execution system, apparatus or device. In the embodiment of the present disclosure, the computer-readable signal medium may include a data signal propagated in a baseband or as a part of a carrier wave, in which a computer-readable program code is carried. This propagated data signal can take a variety of forms including, but not limited to, electromagnetic signal, optical signal or any suitable combination of the above. The computer-readable signal medium may also be any computer-readable medium other than a computer-readable storage medium that can transmit, propagate or transmit a program for use by or in combination with the instruction execution system, apparatus or device. The program code included in the computer-readable medium can be transmitted by any suitable medium, including but not limited to, wireless, wire, optical cable, RF and the like, or any suitable combination of the above.

The flowcharts and block diagrams in the accompanying drawings illustrate the system architecture, functions and operations of possible implementations of the system, method and computer program product according to various embodiments of the present disclosure. In this regard, each square block in the flow diagrams or the block diagrams may represent for a part of a module, a program segment or a code, and a part of the module, the program segment or the code above includes one or more executable instructions for realizing a specified logic function. It should also be noted that the function marked in the square block may also happen in an order different from that marked in the accompanying drawings in some alternative implementations. For example, actually, the two square blocks shown in succession can be basically concurrently executed and may also be executed according to an opposite order sometimes, which is decided by the related function. It should also be noted that each square block in the block diagrams or the flow diagrams as well as a combination of the square blocks in the block diagrams or the flow diagrams can be realized by using a special system based on hardware used for executing the specified function or operation or can be realized by using a combination of special hardware and a computer instruction.

The involved units described in the embodiments of the present disclosure can be realized by software or hardware. The described units may also be disposed in a processor. The names of these units do not constitute a limitation to the unit itself in certain cases.

As another aspect, the present disclosure further provides a non-transitory computer-readable medium. The non-transitory computer-readable medium can be included in the electronic device described in the above embodiment, or exist alone and not be assembled into the electronic device. The above non-transitory computer-readable medium carries one or more programs. When the one or more programs are executed by the electronic device, the electronic device is enabled to realize the method described in the following embodiments. For example, the electronic device can realize each of the steps shown in FIG. 1 and FIG. 2.

It should be noted that although several modules or units of the device for action execution are mentioned in the above detailed description, this division is not mandatory. In fact, according to the implementations of the present disclosure, the features and functions of two or more modules or units described above can be embodied in one module or unit. On the flip side, the features and functions of one module or unit described above can be further divided into being embodied by multiple modules or units.

Other implementations of the present disclosure will be apparent to those skilled in the art from consideration of the specification and practice of the disclosure disclosed here. The present disclosure is intended to cover any variations, uses or adaptive changes of the present disclosure. These variations, uses or adaptive changes follow the general principles of the present disclosure and include common knowledge or conventional technical means in the technical field that are not disclosed in the present disclosure. The specification and embodiments are considered as exemplary only, and the true scope and spirit of the present disclosure is indicated by the following claims.

It should be understood that the present disclosure is not limited to the precise structures described above and shown in the accompanying drawings, and various modifications and changes can be made without departing from the scope of the present disclosure. The scope of the present disclosure is limited only by the appended claims.

What is claimed is:

1. A tag coordinate determination method, comprising:
    generating a tag unit for placing a detection tag;
    setting the detection tag and the tag unit in an image of a photomask, and obtaining a tag position file of the image, the tag position file comprising position coordinates of the tag unit in the image; and
    acquiring position coordinates of a tag to be processed in the image according to the tag position file.

2. The method of claim 1, wherein said generating the tag unit for placing the detection tag comprises:
    generating the tag unit based on a center position of the detection tag, such that a center position of the tag unit coincides with the center position of the detection tag.

3. The method of claim 2, wherein there are a plurality of the detection tags, and each of the plurality of detection tags corresponds to one of the tag units.

4. The method of claim 1, wherein after said generating the tag unit for placing the detection tag, the method further comprises:
    determining a name of the tag unit, so as to generate the tag position file based on the name of the tag unit.

5. The method of claim 4, wherein said obtaining the tag position file of the image comprises:
    outputting, with a drawing tool, the position coordinates of the tag unit in the image of the photomask;
    constructing a mapping relationship between the tag unit and the position coordinates based on the name of the tag unit, to generate the tag position file.

6. The method of claim 5, wherein said acquiring the position coordinates of the tag to be processed in the image according to the tag position file comprises:
    acquiring a coordinate table file comprising a tag name of the tag to be processed, the tag name being a name of the tag unit corresponding to the tag to be processed;
    determining target coordinates corresponding to the tag name by identifying the tag name in the coordinate table file and the name of the tag unit in the tag position file; and
    filling in the coordinate table file with the target coordinates corresponding to the tag name, to obtain the coordinates of the tag to be processed in the image.

7. The method of claim 1, wherein said acquiring the position coordinates of the tag to be processed in the image according to the tag position file comprises:
    capturing, with a table processing tool, coordinates corresponding to the tag to be processed from the tag position file.

8. The method of claim 1, wherein said setting the detection tag and the tag unit in the image of the photomask comprises:
setting the detection tag and the tag unit in a target area in the image of the photomask, the target area at least comprising a dicing lane area of the photomask.

9. The method of claim 1, further comprising: checking whether the position coordinates of the tag unit are coordinates in a rectangular coordinate system with a bottom left corner of the image as an origin.

10. The method of claim 9, wherein if the position coordinates of the tag unit are not the coordinates in the rectangular coordinate system with the bottom left corner of the image as the origin, then converting the position coordinates of the tag unit into the coordinates in the rectangular coordinate system with the bottom left corner of the image as the origin.

11. An electronic device, comprising:
a processor; and
a memory for storing instructions executable by the processor;
wherein the processor is configured to perform:
generating a tag unit for placing a detection tag;
setting the detection tag and the tag unit in an image of a photomask, and obtaining a tag position file of the image, the tag position file comprising position coordinates of the tag unit in the image; and
acquiring position coordinates of a tag to be processed in the image according to the tag position file.

12. The electronic device of claim 11, wherein said generating the tag unit for placing the detection tag comprises:
generating the tag unit based on a center position of the detection tag, such that a center position of the tag unit coincides with the center position of the detection tag.

13. The electronic device of claim 12, wherein there are a plurality of the detection tags, and each of the plurality of detection tags corresponds to one of the tag units.

14. The electronic device of claim 11, wherein after said generating the tag unit for placing the detection tag, the processor is further configured to perform:
determining a name of the tag unit, so as to generate the tag position file based on the name of the tag unit.

15. The electronic device of claim 14, wherein said obtaining the tag position file of the image comprises:
outputting, with a drawing tool, the position coordinates of the tag unit in the image of the photomask;
constructing a mapping relationship between the tag unit and the position coordinates based on the name of the tag unit, to generate the tag position file.

16. A non-transitory computer-readable medium having stored therein instructions that, when executed by a processor, causes the processor to perform a tag coordinate determination method, the method comprising:
generating a tag unit for placing a detection tag;
setting the detection tag and the tag unit in an image of a photomask, and obtaining a tag position file of the image, the tag position file comprising position coordinates of the tag unit in the image; and
acquiring position coordinates of a tag to be processed in the image according to the tag position file.

17. The non-transitory computer-readable medium of claim 16, wherein said generating the tag unit for placing the detection tag comprises:
generating the tag unit based on a center position of the detection tag, such that a center position of the tag unit coincides with the center position of the detection tag.

18. The non-transitory computer-readable medium of claim 17, wherein there are a plurality of the detection tags, and each of the plurality of detection tags corresponds to one of the tag units.

19. The non-transitory computer-readable medium of claim 16, wherein after said generating the tag unit for placing the detection tag, the method further comprises:
determining a name of the tag unit, so as to generate the tag position file based on the name of the tag unit.

20. The non-transitory computer-readable medium of claim 19, wherein said obtaining the tag position file of the image comprises:
outputting, with a drawing tool, the position coordinates of the tag unit in the image of the photomask;
constructing a mapping relationship between the tag unit and the position coordinates based on the name of the tag unit, to generate the tag position file.

* * * * *